(12) United States Patent
Ahn et al.

(10) Patent No.: US 9,948,263 B2
(45) Date of Patent: Apr. 17, 2018

(54) MULTILAYER ELECTRONIC COMPONENT

(71) Applicant: SAMSUNG ELECTRO-MECHANICS CO., LTD., Suwon-Si, Gyeonggi-Do (KR)

(72) Inventors: Young Ghyu Ahn, Suwon-Si (KR); Min Cheol Park, Suwon-Si (KR); Byoung Hwa Lee, Suwon-Si (KR); Dong Hwan Lee, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 133 days.

(21) Appl. No.: 14/866,840

(22) Filed: Sep. 25, 2015

(65) Prior Publication Data
US 2016/0126918 A1 May 5, 2016

(30) Foreign Application Priority Data
Nov. 4, 2014 (KR) .................. 10-2014-0151921

(51) Int. Cl.
*H03H 7/01* (2006.01)
*H03H 1/00* (2006.01)
(Continued)

(52) U.S. Cl.
CPC ........ *H03H 7/0115* (2013.01); *H03H 1/0007* (2013.01); *H01F 27/24* (2013.01); *H01F 27/28* (2013.01); *H01F 27/40* (2013.01); *H01G 4/005* (2013.01); *H01G 4/232* (2013.01); *H01G 4/30* (2013.01); *H01G 4/38* (2013.01); *H01G 4/40* (2013.01); *H03H 2001/005* (2013.01);
(Continued)

(58) Field of Classification Search
CPC .......... H01F 27/24; H01F 27/28; H01F 27/40; H01G 4/005; H01G 4/232; H01G 4/30; H01G 4/38; H01G 4/40; H03H 1/0007; H03H 2001/005; H03H 2001/0057; H03H 2001/0085; H03H 7/0115
USPC .................................................. 333/175, 185
See application file for complete search history.

(56) References Cited

U.S. PATENT DOCUMENTS 5,051,712 A * 9/1991 Naito .................. H01F 17/0013
                                                              333/184
6,483,400 B1 * 11/2002 Phillips, Jr. .......... H03H 7/0115
                                                              333/175
(Continued)

FOREIGN PATENT DOCUMENTS

| JP | 11-097248 A | 4/1999 |
| JP | 2006-157277 A | 6/2006 |
| KR | 10-2007-0039365 A | 4/2007 |

*Primary Examiner* — Benny Lee
*Assistant Examiner* — Jorge Salazar, Jr.
(74) *Attorney, Agent, or Firm* — McDermott Will & Emery LLP

(57) ABSTRACT

A multilayer electronic component includes a body including a dielectric layer and/or a magnetic layer, a terminal part including an input terminal, an output terminal, and a ground terminal connected to the body, and a filter part including a coil part disposed in the body and a capacitor part connected to the coil part and filtering a high frequency component of an input signal input to the input terminal. The capacitor part includes a plurality of first internal electrodes connected to the coil part and a plurality of second internal electrodes exposed to an exterior of the body.

15 Claims, 7 Drawing Sheets

(51) Int. Cl.
  *H01G 4/30*    (2006.01)
  *H01G 4/005*   (2006.01)
  *H01F 27/24*   (2006.01)
  *H01F 27/28*   (2006.01)
  *H01F 27/40*   (2006.01)
  *H01G 4/38*    (2006.01)
  *H01G 4/40*    (2006.01)
  *H01G 4/232*   (2006.01)

(52) U.S. Cl.
  CPC ............. *H03H 2001/0057* (2013.01); *H03H 2001/0085* (2013.01)

(56) References Cited

U.S. PATENT DOCUMENTS

2002/0011905 A1* 1/2002 Ritter .................... H01C 13/02
                                                    333/172
2007/0241839 A1* 10/2007 Taniguchi ............... H03H 7/09
                                                    333/185

* cited by examiner

MULTILAYER ELECTRONIC COMPONENT

CROSS-REFERENCE TO RELATED APPLICATION

This application claims the priority and benefit of Korean Patent Application No. 10-2014-0151921 filed on Nov. 4, 2014, with the Korean Intellectual Property Office, the disclosure of which is incorporated herein by reference.

BACKGROUND

The present disclosure relates to a multilayer electronic component and a board having the same.

In a time division multiple access (TDMA) phone employing a TDMA scheme, a battery voltage may fluctuate when a signal is transmitted, consuming current.

Meanwhile, as a level of output voltage is increased, a signal as well as noise is amplified, and a total harmonic distortion plus noise (THD+N) value may be deteriorated.

In addition, in a terminal using the TDMA scheme, attenuation or noise may be main forms of a transmission fault occurring when data is transmitted.

In order to solve the above-mentioned problem, terminals using the TDMA scheme have used a ferrite bead or a dedicated electro-magnetic interference (EMI) filter. However, research into a dedicated EMI filter by which broadband attenuation characteristics may be improved and an excellent noise reduction effect may be obtained remains necessary.

In addition, demand for a low pass filter including an inductor and a capacitor implemented in a single electronic component, having an excellent audio noise reduction effect, and effectively removing a high frequency component has increased.

SUMMARY

An aspect of the present disclosure may provide a multilayer electronic component and a board having the same.

According to an aspect of the present disclosure, a multilayer electronic component may include a body including a dielectric layer and/or a magnetic layer, a terminal part including an input terminal, an output terminal, and a ground terminal connected to the body, and a filter part including a coil part disposed in the body and a capacitor part connected to the coil part and filtering a high frequency component of an input signal input to the input terminal. The capacitor part may include a plurality of first internal electrodes connected to the coil part and a plurality of second internal electrodes exposed to an exterior of the body.

According to another aspect of the present disclosure, a multilayer electronic component may include a body including a dielectric layer and/or a magnetic layer, an inductor including a plurality of coil portions disposed in the body, a capacitor including a plurality of first internal electrodes connected to the plurality of coils and a plurality of second internal electrodes disposed to face the first internal electrodes and exposed to an exterior of the body, and a plurality of external electrodes disposed on an outer peripheral surface of the body and connected to the coils and the second internal electrodes. The plurality of first internal electrodes may be connected to at least one side surface of the coils. The plurality of second internal electrodes may be exposed to at least one side surface of the body in a width direction of the body. The inductor and the capacitor are provided in plural.

According to another aspect of the present disclosure, a board having a multilayer electronic component may include a printed circuit board having first to third electrode pads disposed thereon and the multilayer electronic component as described above installed on the printed circuit board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
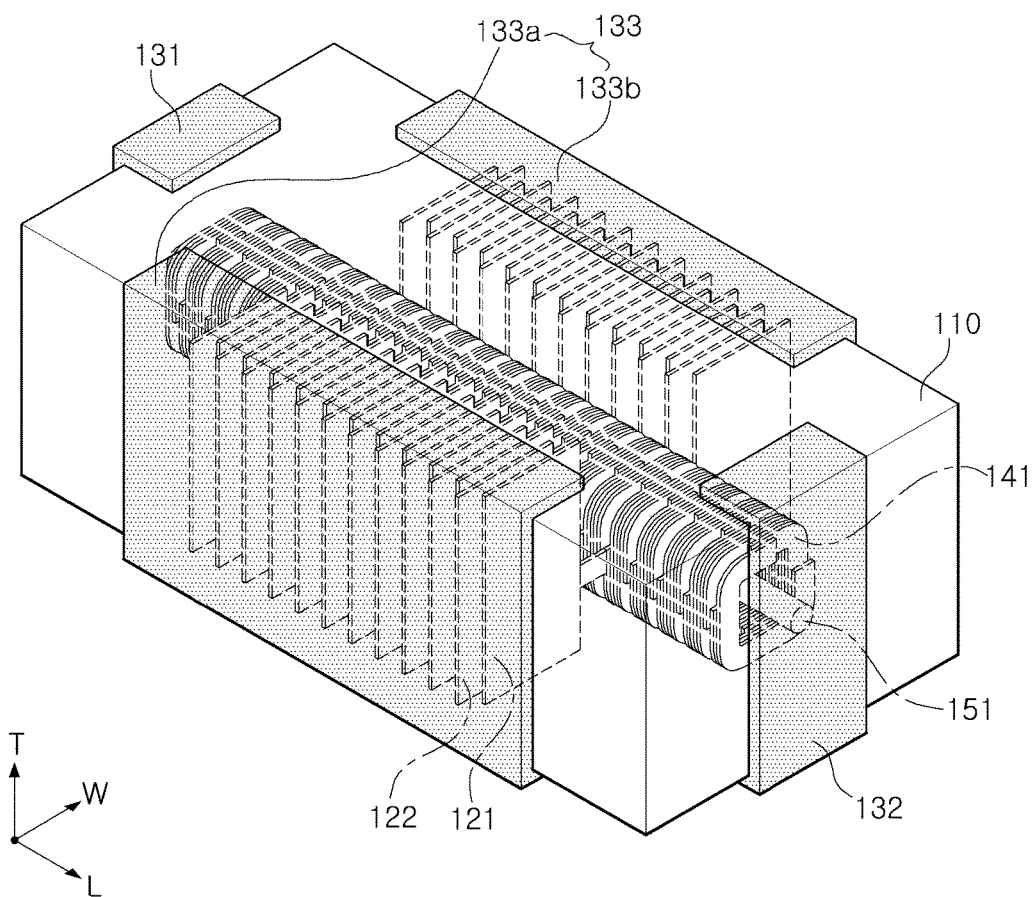
FIG. 1 is a transparent perspective view of a multilayer electronic component according to a first exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined hereinafter in order to clearly describe exemplary embodiments in the present disclosure. L, W and T, illustrated in the accompanying drawings, refer to a length direction, a width direction, and a thickness direction, respectively. Here, a length direction refers to a direction in which dielectric layers or magnetic layers are stacked, and a thickness direction refers to a direction perpendicular with respect to the direction in which the dielectric layers or the magnetic layers are stacked.

Multilayer Electronic Component

Hereinafter, exemplary embodiments in the present disclosure will be described in detail with reference to the accompanying drawings.

FIG. 1 is a transparent perspective view of a multilayer electronic component according to a first exemplary embodiment in the present disclosure.

Figure 2:
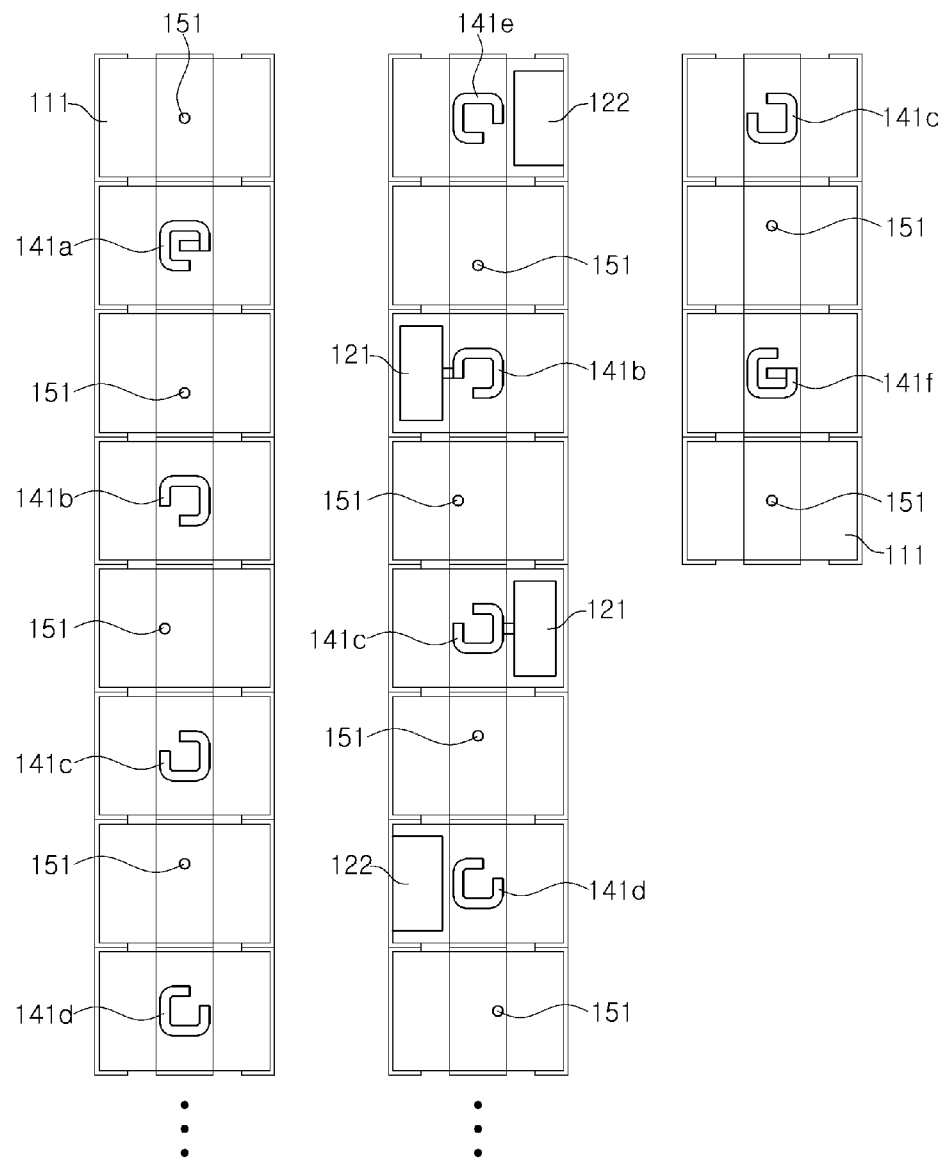
FIG. 2 is a plan view illustrating first to sixth coils and first and second internal electrodes which may be included in the multilayer electronic component illustrated in FIG. 1.

FIG. 2 is a plan view illustrating first to sixth coils and first and second internal electrodes which may be included in the multilayer electronic component illustrated in FIG. 1.

Referring to FIGS. 1 and 2, a multilayer electronic component 100 (FIG. 1) according to the first exemplary embodiment may include a body 110 (FIG. 1) including a dielectric layer and/or a magnetic layer 111 (FIG. 2) and a terminal part including an input terminal 131 (FIG. an output terminal 132 (FIG. 1), and a ground terminal 133 (FIG. 1), for example, ground terminals 133a and 133b (both shown in FIG. 1), connected to the body 110.

According to the present exemplary embodiment, the body 110 may have upper and lower surfaces facing each other, and first and second end surfaces in the length direction of the body as well as first and second side surfaces in the width direction of the body, connecting the upper and lower surfaces to each other.

The body 110 may have a hexahedral shape as illustrated, but is not limited thereto.

The body 110 may include the dielectric layer and/or the magnetic layer 111, and be formed by stacking a plurality of dielectric layers and/or magnetic layers 111.

The plurality of dielectric layers and/or magnetic layers 111 configuring the body 110 may be in a sintered state and integrated with each other such that boundaries between adjacent dielectric layers and/or magnetic layers 111 are not readily apparent.

The dielectric layers configuring the body 110 may be formed by sintering a ceramic green sheet containing a ceramic powder, an organic solvent, and an organic binder. The ceramic powder, a high k material, may be provided as a barium titanate ($BaTiO_3$)-based material, a strontium titanate ($SrTiO_3$)-based material, or the like, but is not limited thereto.

The magnetic layers configuring the body 110 may be formed of an Ni—Cu—Zn-based ferrite material, an Ni—Cu—Zn—Mg-based ferrite material, an Mn—Zn-based ferrite material, or an Fe—Si—B—Cr-based amorphous metal powder material, a metal-based soft magnetic material. However, a material of the magnetic layers is not limited thereto.

The body 110 may include the dielectric layer and/or the magnetic layer 111. In other words, the body 110 may be comprised of dielectric layers 111, comprised of magnetic layers 111, or comprised of both dielectric layers and magnetic layers 111.

For example, when the body 110 includes the magnetic layers 111, a coil part may have a ferrite bead form as described hereinafter.

According to the first exemplary embodiment in the present disclosure, the input terminal 131 and the output terminal 132 may be disposed on both end surfaces of the body 110 in the length direction thereof, respectively, and the ground terminals 133 may be disposed on both side surfaces of the body 110 in the width direction thereof, respectively. However, positions of the input terminal 131, the output terminal 132, and the ground terminals 133 are not necessarily limited thereto.

The multilayer electronic component 100 according to the first exemplary embodiment in the present disclosure may be provided as a low pass filter having an excellent audio noise reduction effect and effectively removing a high frequency component in a terminal using a time division multiple access (TDMA) scheme.

The multilayer electronic component 100 according to the first exemplary embodiment in the present disclosure may receive a signal through the input terminal 131 disposed on the first end surface of the body 110 in the length direction thereof. High frequency noise in the received signal may be removed by the ground terminals 133 disposed on the first and second side surfaces of the body 110 in the width direction thereof. The signal from which the high frequency noise has been removed may be output through the output terminal 132 disposed on the second end surface of the body 110 in the length direction thereof.

The input terminal 131 and the output terminal 132 may be disposed on both end surfaces of the body 110 in the length direction thereof, respectively, and the ground terminals 133 may be disposed on both side surfaces of the body 110 in the width direction thereof and formed to be extended to upper and lower surfaces of the body 110.

According to the first exemplary embodiment in the present disclosure, a mounting surface of the multilayer electronic component 100 may be the lower surface of the body 110.

The input terminal 131, the output terminal 132, and the ground terminals 133 may be formed of a conductive paste containing a conductive metal.

The conductive metal may be provided as nickel (Ni), copper (Cu), tin (Sn), or alloys thereof, but is not limited thereto.

The conductive paste may further contain an insulating material. The insulating material may be provided as, for example, glass, but is not limited thereto.

A method of forming the input terminal 131, the output terminal 132, and the ground terminals 133 is not particularly limited. In detail, the input terminal 131, the output terminal 132, and the ground terminals 133 may be formed on the body by a method such as a printing method, a dipping method, a plating method, or the like.

Subsequently, a plating layer may be further formed on the input terminal 131, the output terminal 132, and the ground terminals 133.

The multilayer electronic component 100 may be provided as a three-terminal LC filter having the input terminal 131, the output terminal 132, and the ground terminals 133, but is not limited thereto.

Referring to FIGS. 1 and 2, the multilayer electronic component 100 according to the first exemplary embodiment in the present disclosure may include a filter part including a coil part 141 disposed in the body 110 and a capacitor part connected to the coil part and filtering a high frequency component of an input signal input to the input terminal 131.

The coil part 141 (FIG. 1) may include coils 141a, 141b, 141c, 141d, 141e, and 141f (141a-141f, shown in FIG. 2) disposed in the body 110 to be perpendicular with respect to a lower surface of the body 110.

The coil part may be formed by printing electrodes relatively thickly on a thin ferrite sheet or a glass ceramic sheet, stacking several sheets on which coil patterns are printed, and connecting the coil patterns to each other through a via.

In detail, the coil part may be formed by disposing the coils 141a, 141b, 141c, 141d, 141e, and 141f on dielectric and/or magnetic layers 111 and connecting the coils 141a, 141b, 141c, 141d, 141e, and 141f to each other through a via 151.

The coils 141a, 141b, 141c, 141d, 141e, and 141f may be disposed in the body 110 to be perpendicular with respect to the lower surface of the body 110, which may be a mounting surface thereof, but are not limited thereto.

According to the first exemplary embodiment in the present disclosure, the coil part may be provided as a ferrite bead able to remove only a noise component without having a large influence on a basic waveform of a signal, even in a case in which frequencies of the basic waveform and the noise component of the signal are substantially the same as each other.

In detail, the coil part may be provided as a giga bead having a pass characteristic lower than an existing pass characteristic by 10 dB or more in a frequency band in the vicinity of 1 GHz, for example, in a range of 0.85 to 1.90 GHz.

Although the respective coils 141a, 141b, 141c, 141d, 141e, and 141f have been illustrated to be one or two in FIG. 2, the numbers of the respective coils 141a, 141b, 141c, 141d, 141e, and 141f are not particularly limited thereto in an actual application, but may be plural.

In addition, the shapes of patterns of the coils 141a, 141b, 141c, 141d, 141e, and 141f illustrated in FIG. 2 are only examples of the present disclosure, and may be provided in various forms in order to adjust a degree of inductance.

The coils may be provided as first to sixth coils 141a, 141b, 141c, 141d, 141e, and 141f. The first coil 141a may be connected to the input terminal 131 disposed on the first end surface of the body 110 in the length direction thereof through the via 151.

In addition, the sixth coil 141f may be connected to the output terminal 132 disposed on the second end surface of the body 110 in the length direction thereof through the via 151.

The capacitor part may include a plurality of first internal electrodes 121 connected to the coil part and a plurality of second internal electrodes 122 exposed to an exterior of the body 110.

The capacitor part may be formed by including a plurality of internal electrodes 121 and 122 (referred to as first and second internal electrodes) sequentially formed on dielectric and/or magnetic layers 111.

The plurality of internal electrodes 121 and 122 may be disposed in the body 110 to be perpendicular with respect to the lower surface of the body 110, but are not limited thereto.

According to the first exemplary embodiment in the present disclosure, the capacitor part may be implemented together with the inductor part having the ferrite bead form as a single electronic component to serve as a filter removing a noise component. Capacitance of the capacitor part may vary depending on an area in which the internal electrodes face each other with each of the dielectric layers or the magnetic layers interposed therebetween.

The capacitor part may be comprised of a plurality of units having different levels of capacitance.

The capacitor part may be formed to have various levels of capacitance, as described below. Thus, one inductor part having the ferrite bead form and capacitors having various forms may be implemented in a single electronic component to serve as a filter removing a noise component.

The filter part including the coil part 141 disposed in the body 110 and the capacitor part connected to the coil part may filter the high frequency component of the input signal input to the input terminal 131.

In addition, the filter part may bypass the high frequency component to the ground terminals 133.

Further, the filter part may output the input signal from which the high frequency component has been removed to the output terminal 132.

Therefore, the multilayer electronic component according to the exemplary embodiment in the present disclosure may be a low pass filter able to effectively remove the high frequency component.

Although two first internal electrodes 121 and two second internal electrodes 122 have been illustrated in FIG. 2, the numbers of the respective first and second internal electrodes 121 and 122 are not particularly limited thereto in an actual application, but may be more numerous.

In addition, the shapes of patterns of the plurality of internal electrodes 121 and 122 illustrated in FIG. 2 are only examples of the present disclosure, and the internal electrodes 121 and 122 may be various shapes in order to adjust a level of capacitance.

The first and second internal electrodes 121 and 122 may be formed on a dielectric layer or a magnetic layer 111 to be spaced apart from each other. Shapes of patterns of the first and second internal electrodes 121 and 122 may be the same as each other, but are not limited thereto, and may be different from each other.

In addition, the first and second internal electrodes 121 and 122 may be disposed on both sides of the coil part 141, but are not necessarily limited thereto.

The plurality of first internal electrodes 121 may be connected to the coil part 141 and disposed to be spaced apart from an outer peripheral surface of the body 110.

The plurality of second internal electrodes 122 may be exposed to both side surfaces of the body 110 in the width direction thereof.

Figure 3:
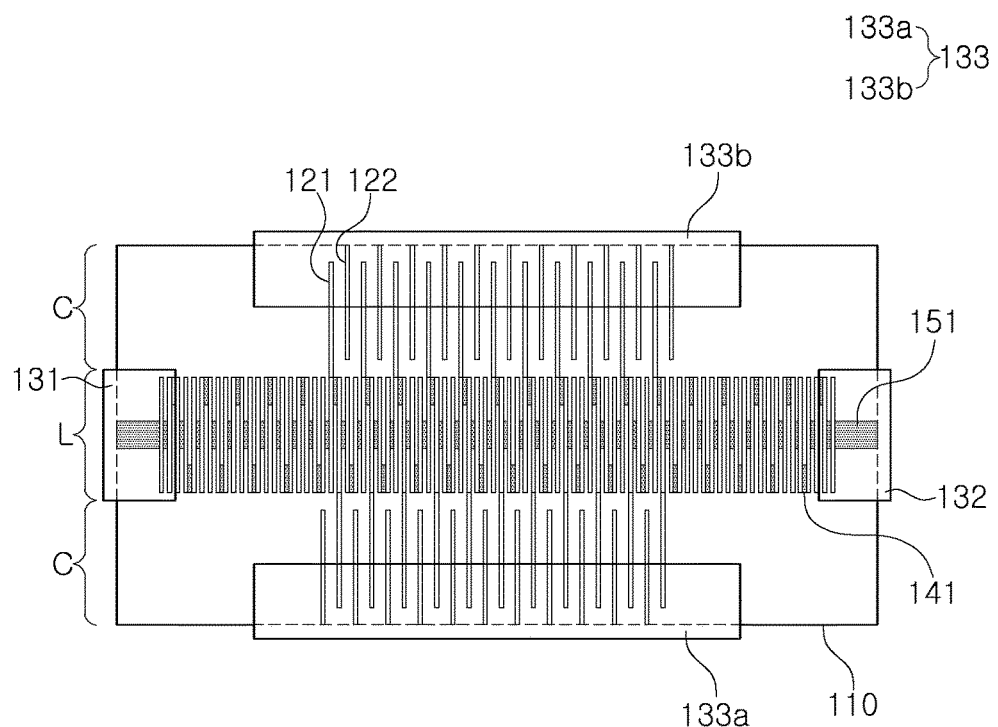
FIG. 3 is a top plan view of the multilayer electronic component illustrated in FIG. 1 as viewed from above.

FIG. 3 is a top plan view of the multilayer electronic component illustrated in FIG. 1 as viewed from above.

Referring to FIG. 3, first and second internal electrodes 121 and 122 comprising a capacitor part C may be disposed on both sides of a coil part L. The first internal electrodes 121 may be connected to the coil part L and disposed to be spaced apart from an outer peripheral surface of a body 110. The second internal electrodes 122 may be exposed to both side surfaces of the body 110 in the width direction thereof.

A shaft of the coil part L may be disposed to be perpendicular with respect to the input terminal 131 and the output terminal 132.

The multilayer electronic component according to the first exemplary embodiment in the present disclosure may be provided as a low pass filter having an excellent audio noise reduction effect and effectively removing the high frequency component by implementing the giga bead and multiple capacitors connected to the coils configuring the giga bead in a single electronic component.

Figure 4:
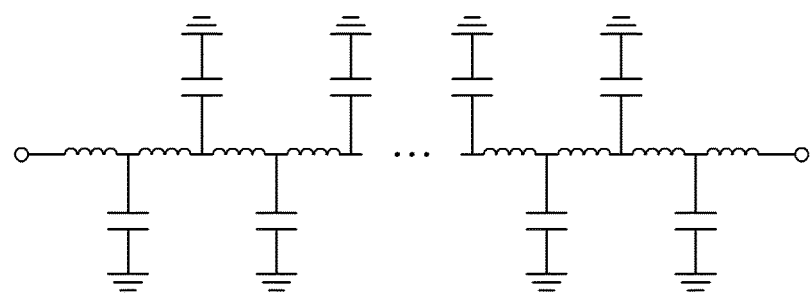
FIG. 4 is an equivalent circuit diagram of the multilayer electronic component illustrated in FIG. 1.

FIG. 4 is an equivalent circuit diagram of the multilayer electronic component illustrated in FIG. 1.

Referring to FIGS. 3 and 4, the coil part L is connected to the input terminal 131 (FIG. 3) and the output terminal 132 (FIG. 3), and the plurality of first internal electrodes 121 (FIG. 3) configuring the capacitor part C are connected to the coils configuring the coil part L, such that a circuit to which inductors and capacitors are alternately connected is configured.

In the circuit to which the inductors and the capacitors are alternately connected in FIG. 4, the capacitor parts are alternately disposed above and below the coil part, but are not limited thereto, and may also be formed in one side of the coil part, as described below.

Figure 5:
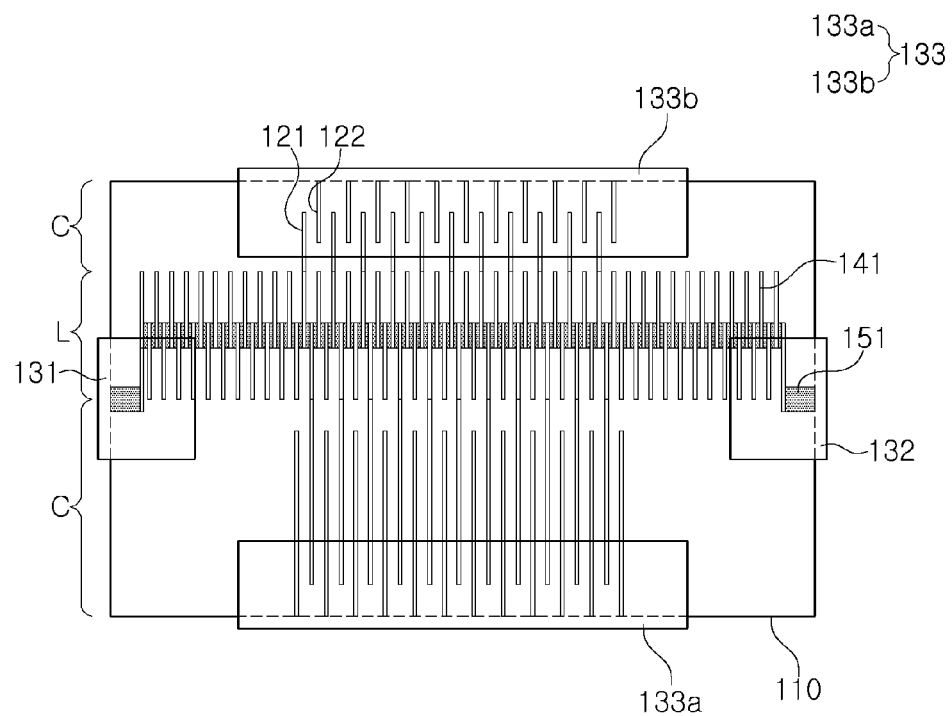
FIG. 5 is a top plan view of a multilayer electronic component according to a second exemplary embodiment in the present disclosure as viewed from above.

FIG. 5 is a top plan view of a multilayer electronic component according to a second exemplary embodiment in the present disclosure as viewed from above.

Referring to FIG. 5, the capacitor part C may include first and second units having different levels of capacitance.

In detail, a width of first internal electrodes 121 connected to the coil part L in one side of the coil part L and a width of first internal electrodes 121 connected to the coil part L in the other side of the coil part L, among the plurality of first internal electrodes 121 configuring the capacitor part C, may be different from each other. For such a reason, an area in which the first internal electrodes 121 connected to the coil part L in one side of the coil part L faces the second internal electrodes 122 and an area in which the first internal electrodes 121 connected to the coil part L in the other side of the coil part L faces the second internal electrodes 122 may be different from each other, and thus, levels of capacitance of the first and second units may be different from each other.

In addition, the center of the input terminal 131 and the output terminal 132 may be disposed to be a distance from the center of the coil part L.

Figure 6:
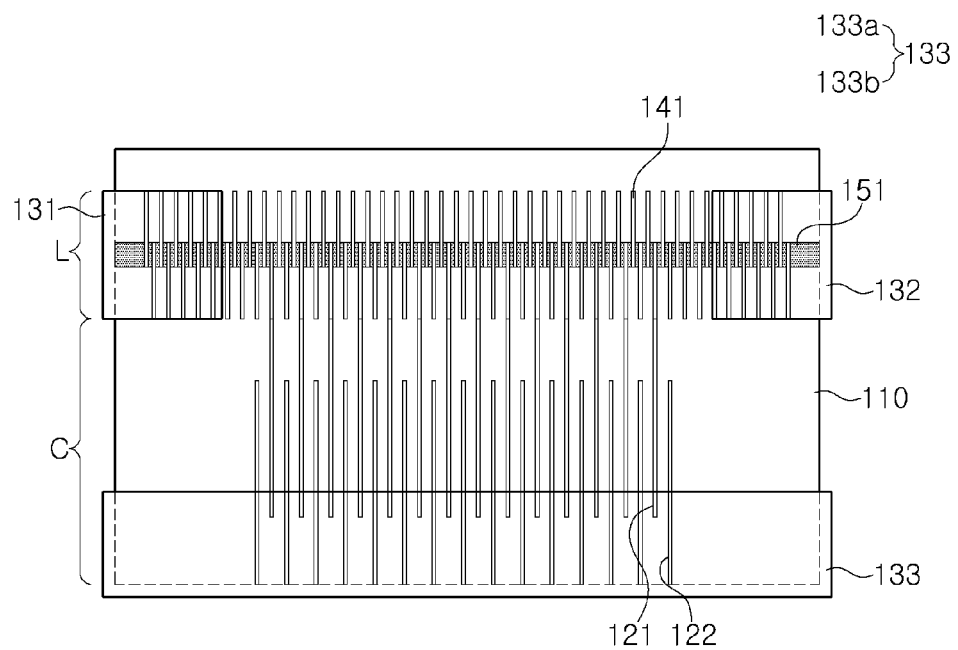
FIG. 6 is a top plan view of a multilayer electronic component according to a third exemplary embodiment in the present disclosure as viewed from above.

FIG. 6 is a top plan view of a multilayer electronic component according to a third exemplary embodiment in the present disclosure as viewed from above.

Referring to FIG. 6, in the multilayer electronic component according to the third exemplary embodiment, a plurality of first internal electrodes 121 may be disposed on one side of a coil part L.

In detail, the plurality of first internal electrodes 121 may be disposed on one side of the coil part L and a plurality of second internal electrodes 122 may also be disposed on one side of the coil part L and exposed to one side surface of a body 110 in a width direction thereof to comprise a capacitor part C.

Figure 7:
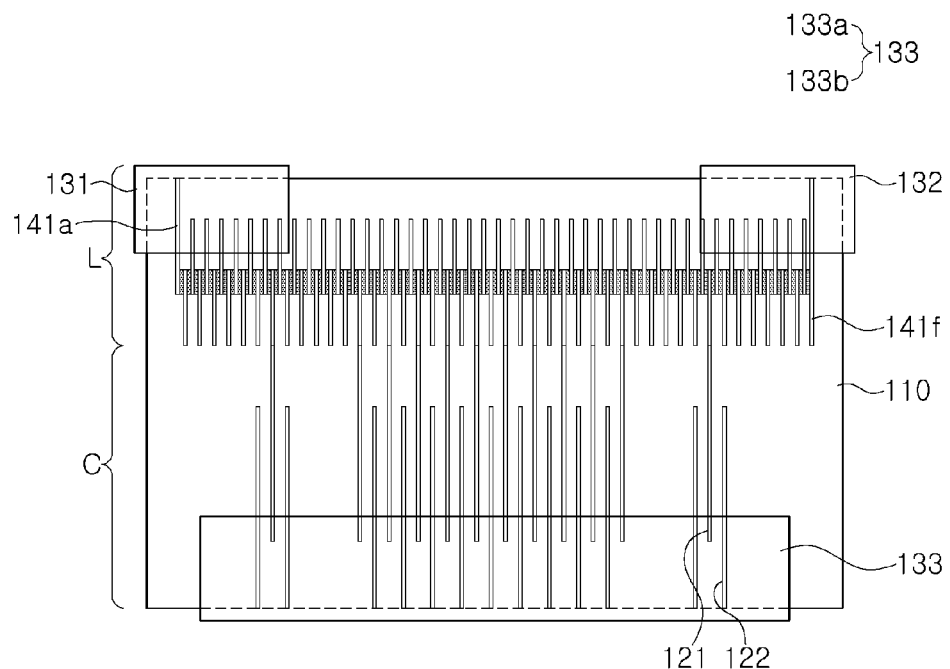
FIG. 7 is a top plan view of a multilayer electronic component according to a fourth exemplary embodiment in the present disclosure as viewed from above.

FIG. 7 is a top plan view of a multilayer electronic component according to a fourth exemplary embodiment in the present disclosure as viewed from above.

Referring to FIG. 7, a plurality of first and second internal electrodes 121 and 122 may be disposed on one side of a coil part L, but a manner in which the plurality of first internal electrodes 121 are connected to the coil part L inside a body 110 may be different from a manner in which the plurality of first internal electrodes 121 are connected to the coil part L in the third exemplary embodiment in the present disclosure.

In detail, the plurality of first internal electrodes 121 connected to the coil part L and the plurality of second internal electrodes 122 may be spaced apart from each other by a predetermined distance in the body 110 to form a plurality of units.

In addition, the input terminal 131 and the output terminal 132 may be disposed on one side surface of the body 110 in a width direction thereof, and directly connected to a first coil 141a and a sixth coil 141f, respectively, without passing through a via 151.

Figure 8:
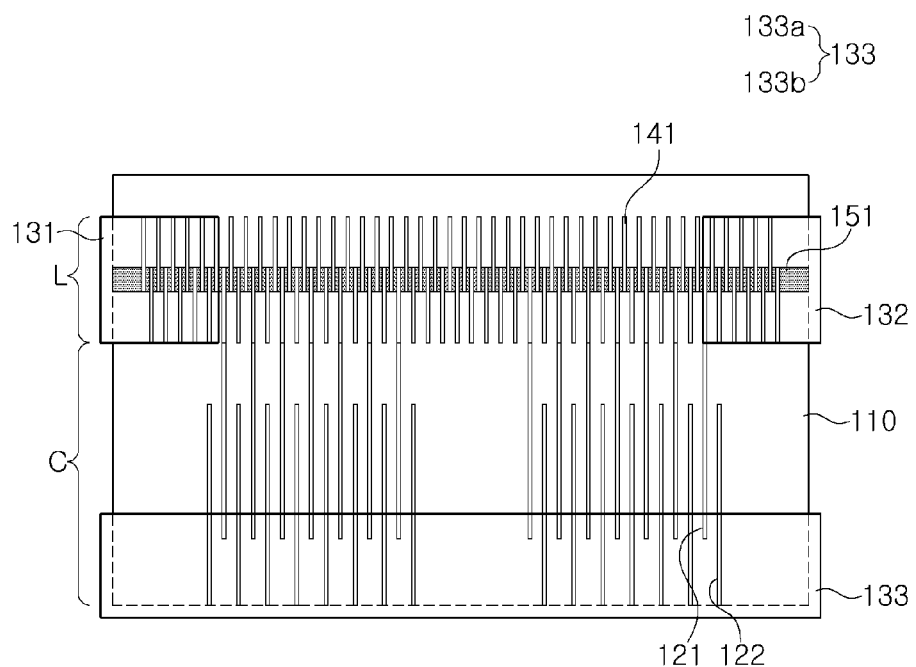
FIG. 8 is a top plan view of a multilayer electronic component according to a fifth exemplary embodiment in the present disclosure as viewed from above.

FIG. 8 is a top plan view of a multilayer electronic component according to a fifth exemplary embodiment in the present disclosure as viewed from above.

Referring to FIG. 8, in the multilayer electronic component according to the fifth exemplary embodiment, a plurality of first internal electrodes 121 may be disposed on one side of a coil part L, like the multilayer electronic component according to the third exemplary embodiment in the present disclosure.

Unlike in the third exemplary embodiment in the present disclosure, a first unit comprising a plurality of first internal electrodes 121 connected to the coil part L and second internal electrodes 122 may be spaced apart from a second unit comprising a plurality of first internal electrodes 121 connected to the coil part L and second internal electrodes 122 by a predetermined distance in the body 110. In addition, the first unit may have the same shape as the shape of the second unit.

Figure 9:
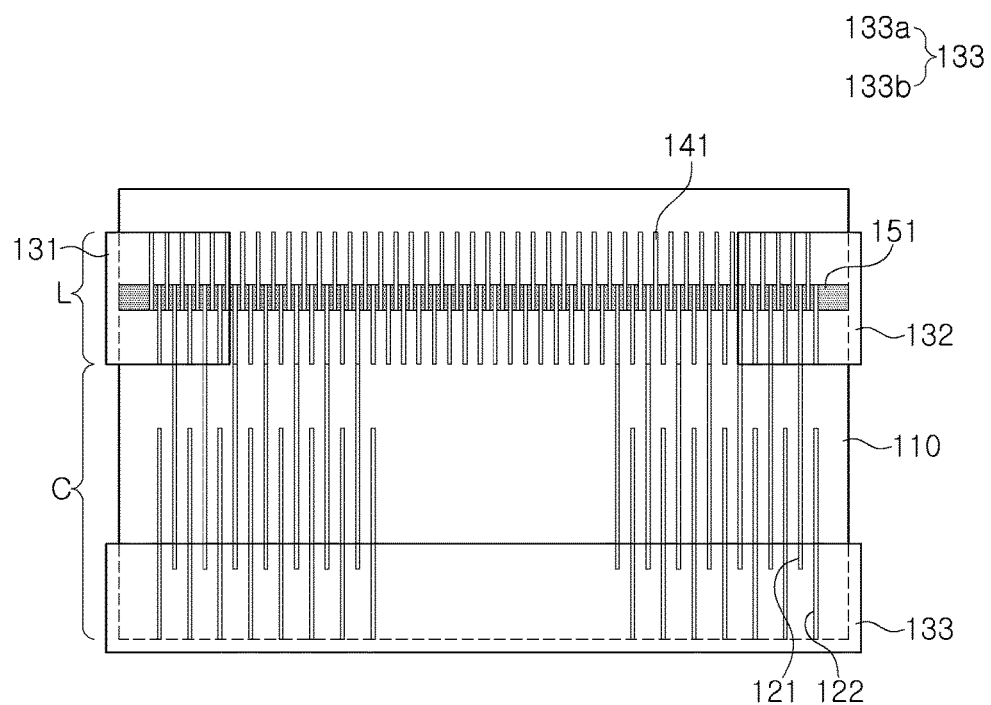
FIG. 9 is a top plan view of a multilayer electronic component according to a sixth exemplary embodiment in the present disclosure as viewed from above.

FIG. 9 is a top plan view of a multilayer electronic component according to a sixth exemplary embodiment in the present disclosure as viewed from above.

Referring to FIG. 9, in the multilayer electronic component according to the sixth exemplary embodiment in the present disclosure, a plurality of first and second internal electrodes 121 and 122 connected to a coil part L may be spaced apart from each other by a predetermined distance in a body 110 to form first and second units having the same shapes, like the multilayer electronic component according to the fifth exemplary embodiment in the present disclosure. The first and second units may be respectively disposed on both end surfaces of the body 110 in the length direction thereof.

Figure 10:
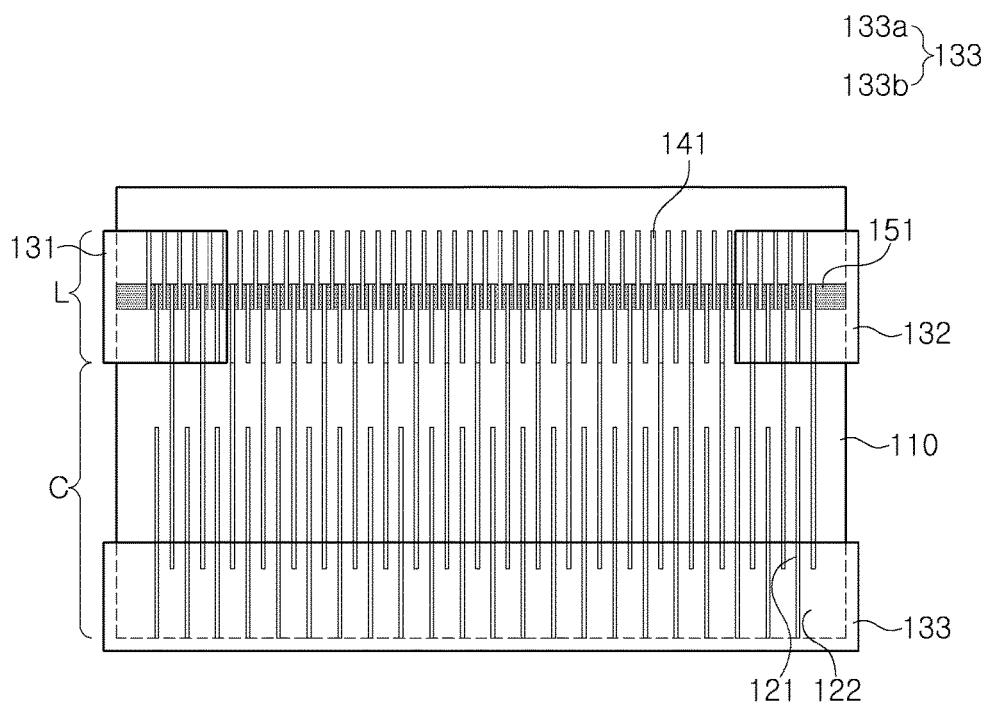
FIG. 10 is a top plan view of a multilayer electronic component according to a seventh exemplary embodiment in the present disclosure as viewed from above.

FIG. 10 is a top plan view of a multilayer electronic component according to a seventh exemplary embodiment in the present disclosure as viewed from above.

Referring to FIG. 10, in the multilayer electronic component according to the seventh exemplary embodiment in the present disclosure, a plurality of first internal electrodes 121 may be disposed on one side of the coil part L, like in the multilayer electronic component according to the third exemplary embodiment in the present disclosure.

In addition, a capacitor part C may be connected along the entire coil part L.

A multilayer electronic component according to another exemplary embodiment in the present disclosure may include a body including a dielectric and/or magnetic layer, an inductor including a plurality of coil portions disposed in the body, a capacitor including a plurality of first internal electrodes connected to the plurality of coils and a plurality of second internal electrodes disposed to face the first internal electrodes and exposed to an exterior of the body, and a plurality of external electrodes disposed on an outer peripheral surface of the body and connected to the coils and the second internal electrodes. The plurality of first internal electrodes may be connected to at least one side surface of the coils. The plurality of second internal electrodes may be exposed to at least one side surface of the body in the width direction thereof. The inductor and the capacitor may be provided in plural, respectively.

Since features of the multilayer electronic component according to the exemplary embodiment in the present disclosure other than the above-mentioned features are the same as those of the multilayer electronic component according to an exemplary embodiment in the present disclosure described above, a description thereof will be omitted.

Figure 11:
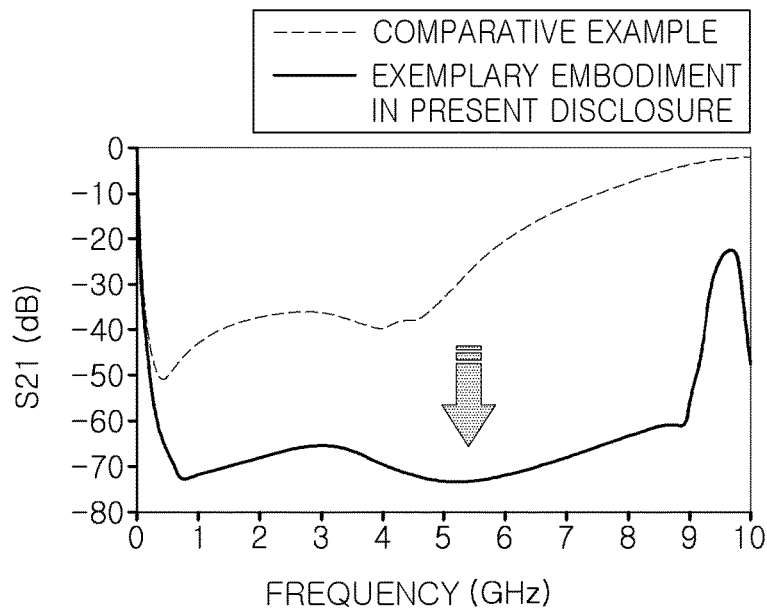
FIG. 11 is a graph comparing pass characteristics (S21) depending on a frequency of the exemplary embodiment in the present disclosure and a comparative example.

FIG. 11 is a graph comparing pass characteristics (S21) of the exemplary embodiment in the present disclosure and a comparative example, varying depending on a frequency.

Referring to FIG. 11, the pass characteristic S21 of the exemplary embodiment in the present disclosure varying depending on the frequency may be more excellent than the pass characteristic S21 of the comparative example, a general LC filter, varying depending on the frequency.

In detail, the pass characteristic of the exemplary embodiment in the present disclosure is lower than the pass characteristic of the comparative example by 10 dB or more, in a frequency band in the vicinity of 1 GHz, for example, in a range of 0.85 to 1.90 GHz.

Board Having Multilayer Electronic Component

Figure 12:
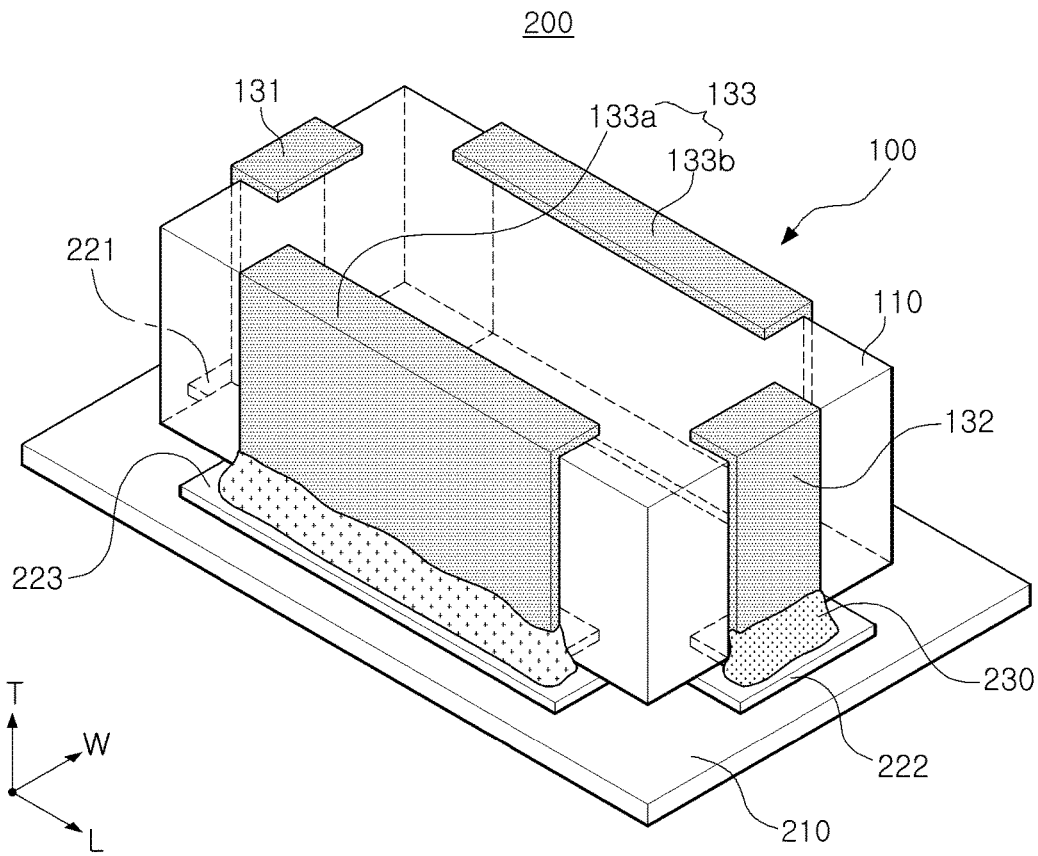
FIG. 12 is a perspective view illustrating the multilayer electronic component of FIG. 1 mounted on a printed circuit board.

FIG. 12 is a perspective view illustrating the multilayer electronic component of FIG. 1 mounted on a printed circuit board.

Referring to FIG. 12, a board 200 having a multilayer electronic component 100 according to the present exemplary embodiment in the present disclosure may include a printed circuit board 210 on which the multilayer electronic component 100 is mounted so that coils and internal electrodes thereof are disposed to be perpendicular with respect to the printed circuit board 210, and first to third electrode pads 221, 222, and 223 disposed on an upper surface of the printed circuit board 210 to be spaced apart from each other.

Here, the multilayer electronic component 100 may be electrically connected to the printed circuit board 210 by a solder 230 in a state in which an input terminal 131, an output terminal 132, and a ground terminal 133, for example, ground terminals 133a and 133b, thereof are disposed on the first to third electrode pads 221, 222, and 223, respectively, to contact thereto.

A description for features overlapped with those of the multilayer electronic component according to the exemplary embodiments in the present disclosure described above, except for the above-mentioned description, will be omitted.

As set forth above, the multilayer electronic component according to the exemplary embodiments in the present disclosure may be a low pass filter having an excellent audio noise reduction effect and effectively removing the high frequency component by implementing the giga bead and multiple capacitors connected to the coils configuring the giga bead in a single electronic component.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a body including a dielectric or magnetic layer;
an input terminal, an output terminal, and a ground terminal each connected to the body; and
a filter part including a coil part disposed in the body and a capacitor part connected to at least a portion of the coil part and filtering a high frequency component of an input signal applied to the input terminal,
wherein the capacitor part includes a plurality of first internal electrodes and a plurality of second internal electrodes sequentially disposed in the body, the plurality of first internal electrodes being connected to the coil part and only the plurality of second internal electrodes being exposed to an exterior of the body.

2. The multilayer electronic component of claim 1, wherein the filter part bypasses the high frequency component to the ground terminal.

3. The multilayer electronic component of claim 1, wherein the filter part outputs the input signal with the high frequency component removed to the output terminal.

4. The multilayer electronic component of claim 1, wherein the plurality of first internal electrodes are spaced apart from an outer peripheral surface of the body.

5. The multilayer electronic component of claim 1, wherein the plurality of first internal electrodes are disposed on both sides of the coil part, and the plurality of second internal electrodes are exposed to both side surfaces of the body in a width direction of the body.

6. The multilayer electronic component of claim 1, wherein the capacitor part comprises a plurality of units having different levels of capacitance.

7. The multilayer electronic component of claim 1, wherein the plurality of first internal electrodes are disposed on one side of the coil part, and the plurality of second internal electrodes are exposed to one side surface of the body in a width direction of the body.

8. The multilayer electronic component of claim 1, wherein a shaft of the coil part is perpendicular with respect to the input terminal and the output terminal.

9. The multilayer electronic component of claim 1, wherein the input terminal is at least partially disposed on one side surface of the body and directly connected to a coil of the coil part and the output terminal is at least partially disposed on one side surface of the body and directly connected to another coil of the coil part.

10. The multilayer electronic component of claim 1, wherein the capacitor part is connected along an entire side of the coil part.

11. A multilayer electronic component comprising:
a body including a dielectric or magnetic layer;
an inductor including a plurality of coils disposed in the body;
a plurality of capacitors, each capacitor including a plurality of first internal electrodes connected to the plurality of coils and a plurality of second internal electrodes disposed to face the first internal electrodes, wherein the plurality of first internal electrodes and the plurality of second internal electrodes are sequentially disposed in the body and only the plurality of second internal electrodes are exposed to an exterior of the body; and
a plurality of external electrodes disposed on outer peripheral surfaces of the body and connected to the coils and the second internal electrodes,
wherein the plurality of first internal electrodes are connected to at least one side of the coils, the plurality of second internal electrodes are exposed to at least one side surface of the body in a width direction of the body.

12. The multilayer electronic component of claim 11, wherein the plurality of first internal electrodes are spaced apart from the outer peripheral surface of the body.

13. The multilayer electronic component of claim 11, wherein the plurality of external electrodes include an input terminal and an output terminal connected to the coils, and a ground terminal connected to the second internal electrodes.

14. The multilayer electronic component of claim 13, wherein the input terminal is at least partially disposed on one side surface of the body and directly connected to a first coil of the plurality of coils of the inductor and the output terminal is at least partially disposed on one side surface of the body and directly connected to a second coil of the plurality of coils of the inductor.

15. The multilayer electronic component of claim 13, wherein a shaft of the coils is perpendicular with respect to the input terminal and the output terminal.

\* \* \* \* \*